US008580668B2

(12) United States Patent
Cho et al.

(10) Patent No.: US 8,580,668 B2
(45) Date of Patent: Nov. 12, 2013

(54) METHOD OF FORMING OHMIC CONTACT LAYER AND METHOD OF FABRICATING LIGHT EMITTING DEVICE HAVING OHMIC CONTACT LAYER

(75) Inventors: Jae-hee Cho, Yongin-si (KR); Dong-seok Leem, Gwangju-si (KR); Tae-yeon Seong, Seoul-si (KR); Cheol-soo Sone, Anyang-si (KR)

(73) Assignee: Samsung Electronics Co., Ltd., Seoul (KR)

( * ) Notice: Subject to any disclaimer, the term of this patent is extended or adjusted under 35 U.S.C. 154(b) by 215 days.

(21) Appl. No.: 11/435,827

(22) Filed: May 18, 2006

(65) Prior Publication Data

US 2006/0270206 A1 Nov. 30, 2006

(30) Foreign Application Priority Data

May 18, 2005 (KR) .................. 10-2005-0041771

(51) Int. Cl.
*H01L 21/44* (2006.01)
(52) U.S. Cl.
USPC .............. 438/597; 257/E25.02; 257/E33.005; 257/E33.024; 257/E33.025; 257/E33.065
(58) Field of Classification Search
USPC ................... 438/597, 608–609; 257/E25.02, 257/E33.005, E33.024, E33.025, E33.065
See application file for complete search history.

(56) References Cited

U.S. PATENT DOCUMENTS

| | | | | |
|---|---|---|---|---|
| 5,623,347 A | * | 4/1997 | Pizzanelli | 359/2 |
| 5,728,508 A | * | 3/1998 | Takemura et al. | 430/315 |
| 5,990,500 A | * | 11/1999 | Okazaki | 257/99 |
| 6,078,064 A | * | 6/2000 | Ming-Jiunn et al. | 257/103 |
| 6,693,352 B1 | * | 2/2004 | Huang et al. | 257/743 |
| 6,693,701 B2 | * | 2/2004 | Hansen | 355/53 |

(Continued)

FOREIGN PATENT DOCUMENTS

| | | |
|---|---|---|
| JP | 2000-196152 | 7/2000 |
| JP | 2004-079972 | 3/2004 |
| JP | 2005-039284 | 2/2005 |
| JP | 2007142028 A * | 6/2007 |

OTHER PUBLICATIONS

Shyi-Ming Pan et al., "Improvement of InGaN-GaN Light-Emitting Diodes With Surface-Textured Indium-Tin-Oxide Transparent Ohmic Contacts," *IEEE Photonics Technology Letters*, May 2003, pp. 649-651, vol. 15, No. 5.

(Continued)

*Primary Examiner* — Thao Le
*Assistant Examiner* — Eric Jones
(74) *Attorney, Agent, or Firm* — Buchanan Ingersoll & Rooney PC

(57) ABSTRACT

A method of manufacturing an ohmic contact layer and a method of manufacturing a top emission type nitride-based light emitting device having the ohmic contact layer are provided. The method of manufacturing an ohmic contact layer includes: forming a first conductive material layer on a semiconductor layer; forming a mask layer having a plurality of nano-sized islands on the first conductive material layer; forming a second conductive material layer on the first conductive material layer and the mask layer; and removing the portion of the second conductive material on the islands and the islands through a lift-off process using a solvent. The method ensures the maintenance of good electrical characteristics and an increase of the light extraction efficiency.

19 Claims, 9 Drawing Sheets

(56) References Cited

U.S. PATENT DOCUMENTS

| | | | |
|---|---|---|---|
| 7,109,048 B2* | 9/2006 | Ha et al. ............................ | 438/22 |
| 2002/0179918 A1* | 12/2002 | Sung et al. ....................... | 257/99 |
| 2002/0185732 A1* | 12/2002 | Ho et al. ......................... | 257/734 |
| 2003/0062530 A1 | 4/2003 | Okazaki et al. | |
| 2003/0141509 A1* | 7/2003 | Udagawa ......................... | 257/79 |
| 2004/0084685 A1* | 5/2004 | Yabusaki et al. ................. | 257/95 |
| 2004/0114652 A1* | 6/2004 | Yoshikawa ....................... | 372/46 |
| 2004/0169191 A1* | 9/2004 | Udagawa ......................... | 257/99 |
| 2004/0222524 A1* | 11/2004 | Song et al. ...................... | 257/744 |
| 2005/0052878 A1* | 3/2005 | Yamada et al. ............... | 362/460 |
| 2005/0067625 A1* | 3/2005 | Hata ............................... | 257/81 |
| 2005/0133809 A1* | 6/2005 | Song et al. ....................... | 257/99 |
| 2006/0146245 A1* | 7/2006 | Ahn et al. ...................... | 349/139 |
| 2009/0224282 A1* | 9/2009 | Kamei ........................... | 257/103 |

OTHER PUBLICATIONS

Y.C. Lin et al., "InGaN/GaN light emitting diodes with Ni/Au, Ni/ITO and ITO p-type contacts," *Solid-State Electronics*, 2003, pp. 849-853, vol. 47, Elsevier Science Ltd.

Notice of Office Action dated Aug. 30, 2011, issued in the corresponding Japanese Patent Application No. 2006-133055, and an English Translation thereof.

* cited by examiner

METHOD OF FORMING OHMIC CONTACT LAYER AND METHOD OF FABRICATING LIGHT EMITTING DEVICE HAVING OHMIC CONTACT LAYER

CROSS-REFERENCE TO RELATED PATENT APPLICATION

This application claims the benefit of Korean Patent Application No. 10-2005-0041771, filed on May 18, 2005, in the Korean Intellectual Property Office, the disclosure of which is incorporated herein in its entirety by reference.

BACKGROUND OF THE DISCLOSURE

1. Field of the Disclosure

The present disclosure relates to an ohmic contact layer and a light emitting device having the same, and more particularly, to an ohmic contact layer which can enhance the light extraction efficiency of a top emission type light emitting device and a light emitting device having the same.

2. Description of the Related Art

The effective supply of current to a semiconductor light emitting device is significantly influenced by an ohmic contact between a semiconductor layer and an electrode. A light emitting device made of a nitride semiconductor, for example, a gallium nitride semiconductor, needs a particularly good ohmic contact. Ohmic contacts of nitride semiconductor light emitting devices are still unsatisfactory in spite of continuous research thereon because of low carrier concentration, high sheet resistance, and low electric conductivity of the p-type gallium nitride. In addition, since internally generated light is emitted through an ohmic electrode layer in a top light emission type light emitting device, the ohmic contact layer must have good electrical characteristics and high light transmittance.

A conventional ohmic contact layer of a top light emission type light emitting device includes a nickel (Ni) layer and a gold (Au) layer sequentially stacked on a second cladding layer. The ohmic contact layer formed of the stacked metal layers has a low specific contact resistance of about $10^{-3}$ to $10^{-4}$ $\Omega cm^2$ after being heat-treated under an oxygen or air atmosphere. However, such a conventional Ni/Au ohmic contact layer has low light extraction efficiency due to its low light transmittance, i.e., about 75% at $\lambda=450$ nm. Accordingly, although the ohmic contact layer has low specific contact resistance, the ohmic contact layer cannot be employed in a next generation top light emission type light emitting device having high-output power and high luminance because of its low light transmittance.

To overcome the output power limitations of top emission type light emitting devices, the use of a transparent conductive oxide, for example, ITO, having excellent light transmittance has been suggested [T. Margalith et al., Appl. Phys. Lett. Vol. 74, p 3930 (1999).]

Y. C. Lin et al. discloses a Ni/ITO ohmic contact layer having an 86.6% greater transmittance than a conventional Ni/Au ohmic contact layer used to form a top emission type device having 1.3 times the light output power [Y. C. Lin et al., Solid-State Electronics Vol. 47, p 849 (2003)].

Recently, an electrode surface texturing method has been suggested to maximize the light extraction efficiency of devices. In the electrode surface texturing method, a NiO/ITO ohmic contact layer, for example, is formed on GaN, and then, the ITO electrode is patterned using a plasma etching photolithography method to form holes having diameters of several micrometers in the ITO electrode, thereby increasing the light output power by about 16% [by S.-M. Pan et al., in IEEE Photon. Technol. Left. Vol. 15 p 649 (2003)]. However, since the holes formed in the surface of the electrodes using the electrode surface texturing method have diameters of several micrometers, the light extraction efficiency thereof cannot be maximized. In particular, the device performance may be degraded due to plasma damage to the device during etching.

SUMMARY OF THE DISCLOSURE

The present invention may provide a method of manufacturing an ohmic contact structure having high light transmittance and good electrical characteristics and a method of manufacturing a top light emission type light emitting device having the ohmic contact structure.

According to an aspect of the present invention, there is provided a method of manufacturing an ohmic contact layer which is used for a light emitting device and includes a first conductive material layer and a second conductive material layer having through-holes corresponding to islands, the method including: forming a first conductive material layer on a semiconductor layer; forming a mask layer including a plurality of nano-sized islands on the first conductive material layer; forming a second conductive material layer on the first conductive material layer and the islands in the mask layer; and removing the portion of the second conductive material on the islands and the islands through a lift-off process using a solvent.

According to another aspect of the present invention, there is provided a method of manufacturing an ohmic contact layer which is used for a light emitting device and includes a first conductive material layer and a second conductive material layer having through-holes corresponding to islands, the method including: forming a stacked structure including a first cladding semiconductor layer, an activation layer, and a second cladding semiconductor layer on a substrate; forming a first conductive material layer on the second cladding semiconductor layer; forming a mask layer including a plurality of islands on the first conductive material layer; forming a second conductive material layer on the first conductive material layer and the islands in the mask layer; and removing the portion of the second conductive material on the islands and the islands through a lift-off process using a solvent.

The first and second conductive material layers may be formed of a transparent conductive oxide or transparent conductive nitride.

The transparent conductive oxide may include at least one metal oxide and the metal may be selected from the group consisting of In, Sn, Zn, Ga, Ce, Cd, Mg, Be, Ag, Mo, V, Cu, Ir, Rh, Ru, W, Co, Ni, Mn, Al, and lanthanide metals.

The transparent conductive nitride may be titanium nitride or tantalum nitride.

The method may further include, before the forming of the first conductive material layer, forming a metal thin film layer on the semiconductor layer, wherein the first conductive material layer is formed on the metal thin film layer. The metal thin film layer may have a thickness of approximately 0.1 to 50 nm.

The metal thin film layer may be formed of a material selected from the group consisting of Ni, Co, Cu, Pd, Pt, Ru, Ir, Au, Ag, Cr, Rh, In, Sn, Mg, Zn, Be, Sr, Ba, an alloy thereof, and a solid solution thereof.

The forming of the mask layer may further include: coating a photoresist on the first conductive material layer; exposing the photoresist to form a latent image corresponding to the islands in the photoresist; and forming the islands on the first conductive material layer by developing the photoresist using an solvent.

The exposing of the photoresist may be performed through laser holography using laser interference or electron beam lithography.

BRIEF DESCRIPTION OF THE DRAWINGS

The above and other features and advantages of the present invention will be described in detailed exemplary embodiments thereof with reference to the attached drawings in which.

DETAILED DESCRIPTION OF EXEMPLARY EMBODIMENTS

Hereinafter, the present invention will be described more fully with reference to the accompanying drawings, in which exemplary embodiments of the invention are shown.

In an embodiment of the present invention, a contact layer that is not damaged by the impact of, for example, ions, and has a 3-dimensional pattern is formed. The contact layer includes at least a first conductive material layer and a second conductive material layer formed on the first conductive material layer. The second conductive material layer has a plurality of hole arrays. The holes may be circular or rectangular.

The second conductive material layer having the plurality of hole arrays is formed using a lift-off method, and a photoresist used as a sacrificial layer in the lift-off method is exposed by scanning electron beams or a laser hologram which can perform fine patterning. In addition, the sacrificial layer can be patterned using a well known imprint method. The method of patterning the sacrificial layer can be one of various methods, but does not limit the present invention. The laser holography is one of the best methods for exposure based on experimental results.

A method of forming an ohmic contact layer can be understood through the description of a method of manufacturing a nitride-based light emitting device according to embodiments of the present invention provided herein.

Figure 1:
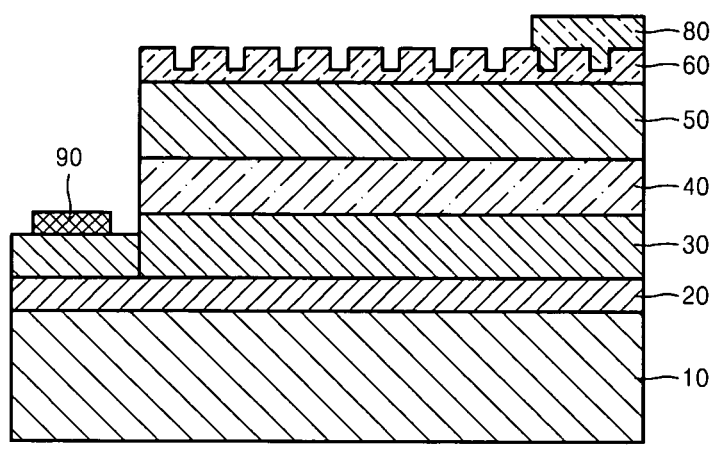
FIG. 1 is a cross-sectional view of a top light emission type light emitting device manufactured according to an embodiment of the present invention.

FIG. 1 is a cross-sectional view of a top emission type nitride-based light emitting device including electrodes manufactured according to an embodiment of the present invention.

Referring to FIG. 1, the nitride-based light emitting device includes a substrate 10, a buffer layer 20 disposed on the substrate 10, a n-type lower semiconductor layer, for example, a first cladding layer 30, disposed on the buffer layer 20, an activation layer 40 disposed on the first cladding first cladding layer 30, an p-type upper semiconductor layer, for example, a second cladding second cladding layer 50, disposed on the activation layer 40, and a p-ohmic contact layer 60 which is formed of a transparent conductive thin film, has a 3-dimensional pattern, and is disposed on the second cladding layer 50. A first conductive pad 90 is electrically connected to the first cladding layer 30, and a second conductive pad 80 is connected to the p-ohmic contact layer 60.

The substrate 10 may be formed of sapphire ($Al_2O_3$), silicon carbide (SiC), silicon (Si), or gallium arsenide (GaAs). The buffer layer 20 is optional, but is required when the substrate 10 is formed of an insulating material.

Each layer from the buffer layer 20 to the second cladding layer 50 is formed of a III group nitride-based compound represented by $Al_xIn_yGa_zN$ ($0 \leq x \leq 1$, $0 \leq y \leq 1$, $0 \leq z \leq 1$, and $0 \leq x+y+z \leq 1$), and the first cladding layer 30 and the second cladding layer 50 further include dopants.

In addition, the activation layer 40 has a single quantum wall (SQW) structure or a multiple quantum wall (MQW) structure.

As an example, in a gallium nitride (GaN) compound semiconductor, the buffer layer 20 is formed of GaN, the first cladding layer 30 is formed of GaN with n-type dopants, for example, Si, Ge, Se, or Te, the activation layer 40 includes an InGaN/GaN MQW or AlGaN/GaN MQW, and the second cladding layer 50 is formed of GaN with p-type dopants, for example, Mg, Zn, Ca, Sr, or Be. Upper and lower guide layers may be formed on and below the activation layer 40.

An n-type ohmic contact layer (not illustrated) may be disposed between the first cladding layer 30 and the first conductive pad 90 and the n-type ohmic contact layer may have various commonly known structures, for example, a sequentially stacked structure of Ti and Al.

The second conductive pad 80 may have a sequentially stacked structure of Ni and Au or a stacked structure of W/Au, Pt/Au, Pd/Au, or Ag/Au.

Each of the layers can be formed using a commonly known deposition method such as electron-beam evaporation, physical vapor deposition (PVD), chemical vapor deposition (CVD), plasma laser deposition (PLD), dual-type thermal evaporator, or sputtering.

The p-ohmic contact layer 60 having a 3-dimensional texture shaped pattern, which characterizes an embodiment of the present invention, includes an at least two layer stacked structure including a first conductive material layer and a second conductive material layer on the first conductive material layer, and the second conductive material layer is patterned by lift-off using a sacrificial layer. In the lift-off, the semiconductor layer is not damaged by the impact of ion, which occurs in conventional dry etching. The second conductive material layer has a plurality of hole arrays. The holes may be circular or rectangular. A photoresist used as the sacrificial layer is exposed by the scanning electron beams or the laser hologram which can perform fine patterning. In addition, the sacrificial layer can be patterned using a well-known imprint method. The photoresist can be exposed to have a predetermined pattern using the laser hologram, which uses interference characteristics of light.

The ohmic contact layer 60 may have a thickness of approximately 20 to 1000 nm, and may be formed of a transparent conductive oxide or a transparent conductive nitride.

The transparent conductive oxide can include at least one metal oxide, and the metal is selected from the group consisting of In, Sn, Zn, Ga, Ce, Cd, Mg, Be, Ag, Mo, V, Cu, Ir, Rh, Ru, W, Co, Ni, Mn, Al, and lanthanide metals.

In addition, the transparent conductive nitride can include at least one of titanium nitride and tantalum nitride.

The electrical characteristics of the ohmic contact layer 60 can be improved by doping dopants into the transparent conductive oxide or the transparent conductive nitride. The dopants can be metal to a concentration of approximately 0.001 to 20 wt %.

In a process of forming the ohmic contact layer 60, the deposition of the transparent conductive oxide or the transparent conductive nitride is performed at, for example, 20 to 1000° C. under vacuum or in a gaseous atmosphere.

The ohmic contact layer 60 formed by depositing the transparent conductive oxide or the transparent conductive nitride is heat-treated in a temperature ranging from room temperature to approximately 900° C. for approximately 10 seconds to 3 hours. The heat-treatment is performed in an atmosphere having at least one gas selected from nitrogen, argon, helium, oxygen, hydrogen, and air, or under a vacuum.

Figure 2:
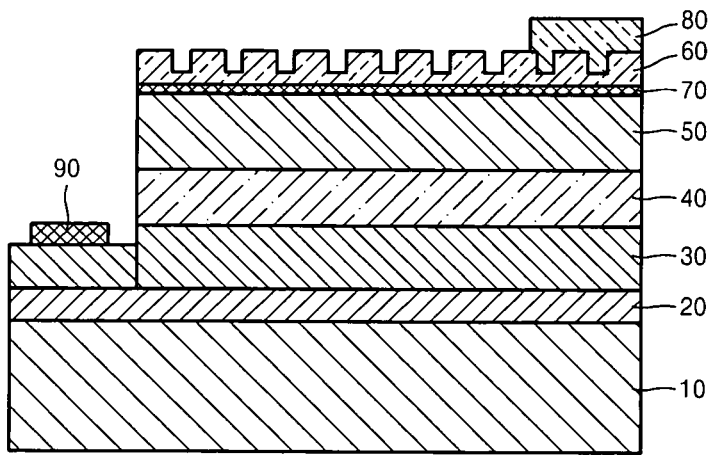
FIG. 2 is a cross-sectional view of a top light emission type light emitting device manufactured according to another embodiment of the present invention.

FIG. 2 is a cross-sectional view of a top emission type nitride-based light emitting device manufactured according to another second embodiment of the present invention.

Referring to FIG. 2, the light emitting device includes a metal thin film layer 70 interposed between the ohmic contact layer 60 and the second cladding semiconductor layer 50 to improve ohmic contact characteristics between the ohmic contact layer 60 and the second cladding semiconductor layer 50.

The metal thin film layer 70 may have a thickness of approximately 0.1 to 50 nm. The metal thin film layer 70 may have high conductivity, have a high work function, and be made of a material which easily forms a gallium (Ga)-based compound. For example, the metal thin film layer 70 may be composed of a material selected from the group consisting of Ni, Co, Cu, Pd, Pt, Ru, Ir, Au, Ag, Cr, Rh, In, Sn, Mg, Zn, Be, Sr, Ba, and an alloy or solid solution thereof.

Since the metal thin film layer 70 has high conductivity, when contacting the upper patterned transparent conductive thin film layer such as the ohmic contact layer 60, the metal thin film layer 70 improves current distribution, thereby decreasing the specific contact resistance in the p-type ohmic electrode structure.

FIGS. 3A through 3F illustrate a method of forming the ohmic contact layer 60 (the conductive thin film layer) on the second cladding semiconductor material layer such as the second cladding layer 50.

The above-described regular stacked structure of a light emitting device including the buffer layer 20, the first cladding semiconductor layer such as the first cladding layer 30, the activation layer 40, and the second cladding layer 50 is formed on the substrate using typical processes before forming the ohmic contact layer 60.

Figure 3A:
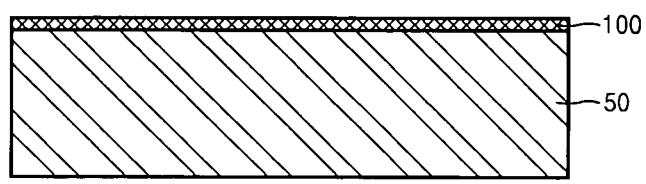
FIGS. 3A through 3F illustrate a method of forming an ohmic contact layer on the structure of FIG. 1 or 2.

Referring to FIG. 3A, a first transparent conductive material layer 100 having a thickness of approximately 0.1 to 300 nm is formed on the second cladding layer 50.

Figure 3B:
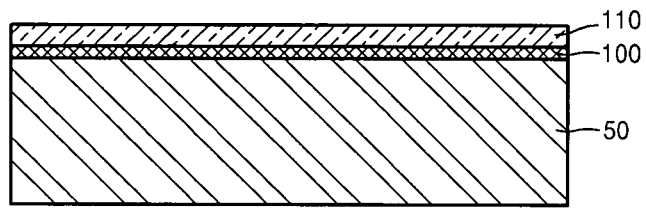

Referring to FIG. 3B, a photoresist is coated to a thickness ranging from approximately 10 nm to 2 μm on the first conductive material layer 100 using, for example, a spin coater to form a sacrificial layer 110.

Figure 3C:
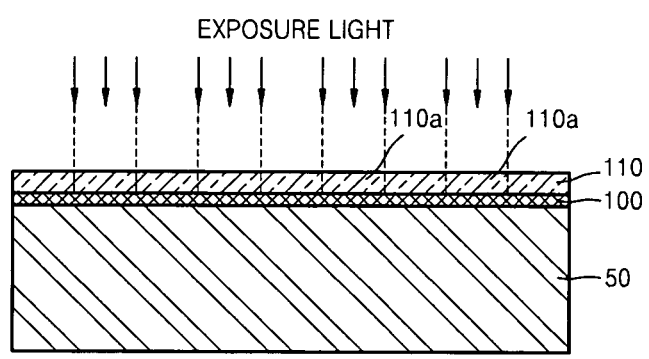

Referring to FIG. 3C, the photoresist is pre-baked, and then exposed. The exposure is performed using electron beam exposure or laser hologram exposure, as described above. After the exposure, a latent image having exposed regions and unexposed regions is formed.

In an embodiment of the present invention, the laser hologram exposure is used. A laser holography apparatus is used for the laser hologram exposure. In the laser hologram exposure, an interference pattern corresponding to a desired pattern is irradiated onto the portion of the sacrificial layer 110 which will not be unexposed. The laser is radiated for several seconds to several minutes to perform a first exposure on the sacrificial layer 110, the structure is properly rotated 0 to 90°, and then a second exposure is performed.

Figure 3D:
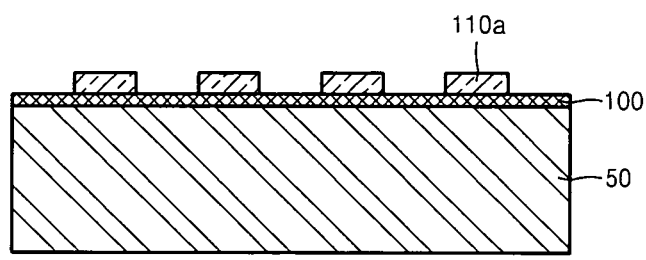

Referring to FIG. 3D, the sacrificial layer 110 is developed using an etching developer to obtain a nano-sized island array 110a which is 2-dimensionally arranged with a predetermined size and period. After forming the island array 110a, the upper surface of the first conductive material layer 100 is divided into regions covered by the islands and regions not covered by the islands. The size and period of the island array 110a can be appropriately controlled. When using the laser hologram, the size and period of the island array 110a can be controlled by changing the wavelength or the incident angle of the laser.

Figure 3E:
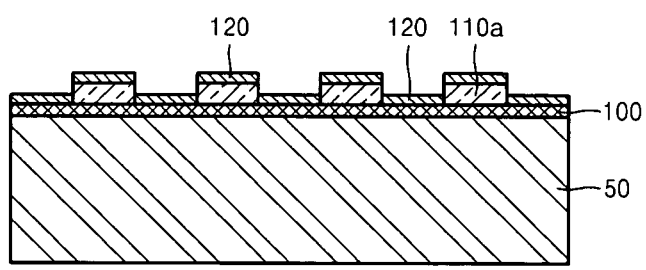

Referring to FIG. 3E, a second conductive material layer 120 having a thickness of approximately 20 to 700 nm is formed on the island array 110a using a commonly known deposition method, for example, electron beam deposition, sputtering, or PLD. The second conductive material layer 120 is formed of the above-described transparent conductive oxide or transparent conductive nitride.

Immediately after being deposited, the second conductive material layer 120 is divided into nano-sized portions which are formed on the island array 110a of the sacrificial layer 110 and will be removed, and portions which are formed on the first conductive material layer 110 will form the ohmic contact layer 60 with the first conductive material 110.

Figure 3F:
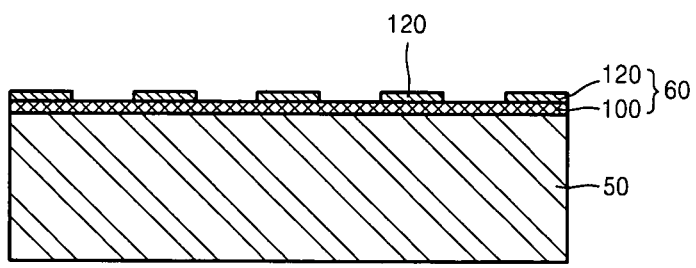

Referring to FIG. 3F, the sacrificial layer 110 is removed through a lift-off process using a solvent to partially remove the portion of the second conductive material layer 120 disposed on the island array 110a, thereby forming a nano-sized second conductive material layer 120 in which holes having a well shape are arranged in an array. Thus, the ohmic contact layer 60 is formed on the second cladding semiconductor material layer 50 of the light emitting device. When the lift-off is performed, an ultrasonic cleaning process or an ultrasonic spraying process may be employed to effectively remove the photoresist.

Figure 4:
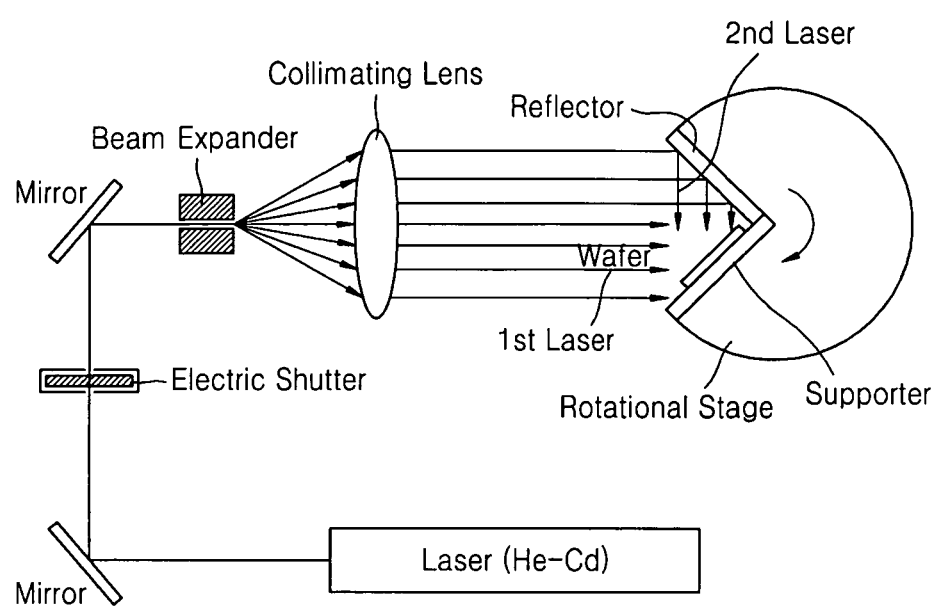
FIG. 4 is a schematic diagram of a laser holography apparatus used in the manufacturing method illustrated in FIGS. 3A through 3F.

FIG. 4 is a schematic diagram of a laser holography apparatus used for forming an ohmic contact according to an embodiment of the present invention.

Referring to FIG. 4, a laser generated by a He—Cd gas laser apparatus is transmitted to a beam expander via a laser transmitting pathway having an electric shutter and a plurality of mirrors. The laser is diverged by the beam expander and collimated by a collimating lens. A reflector and a supporter having a predetermined inclined angle, for example, 45°, with respect to the laser transmitting axis, and a rotational stage supporting the reflector and the supporter are disposed after the collimating lens along the laser path. The laser passes through the collimating lens and is radiated onto the reflector and a wafer. The laser radiated onto the reflector is reflected by the reflector, and then radiated to the wafer. Accordingly, the wafer is irradiated with a first laser directly radiated from the collimating lens and a second laser indirectly radiated through the reflector such that an interference pattern caused by the first laser and the second laser is formed on the wafer. A grating pitch ($\Lambda$) for forming the interference pattern is determined by the angle ($\theta$) between the first laser and the second laser radiated onto the wafer as follows:

$$\Lambda = \lambda/(2 \sin \theta) \quad (1)$$

where $\lambda$ is a wavelength of the laser.

The above-described latent image can be formed on the photoresist, i.e., the sacrificial layer, formed on the surface of the wafer using the laser holography apparatus.

The laser holography apparatus is described in Appl. Phys. Lett 11, 326, 1967 by L. D. Siebert, and Appl. Phys. Lett 20, 490 1972 by G. Decker.

Figure 5A:
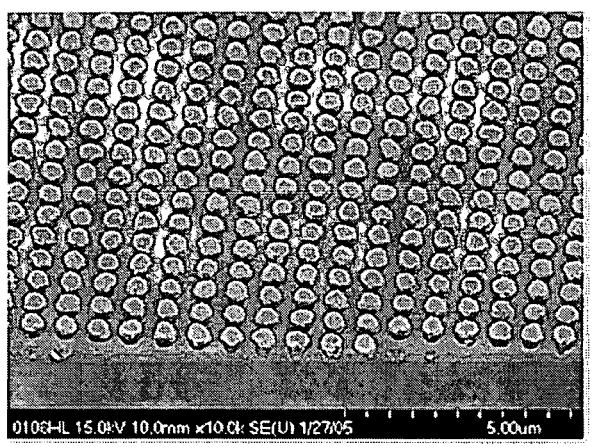
FIGS. 5A through 5C are scanning electron microscopy (SEM) images showing a light emitting device manufactured using a method according to an embodiment of the present invention.
Figure 5B:
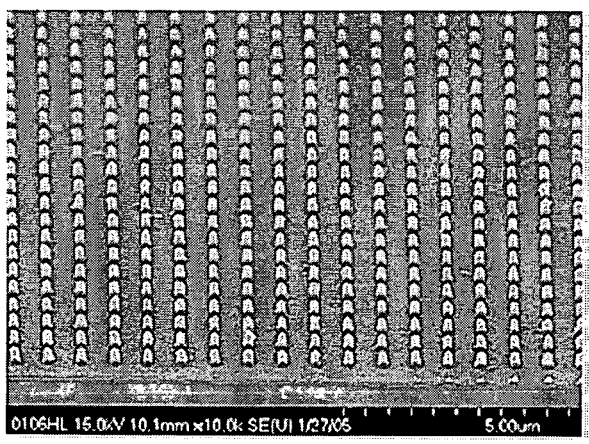
Figure 5C:
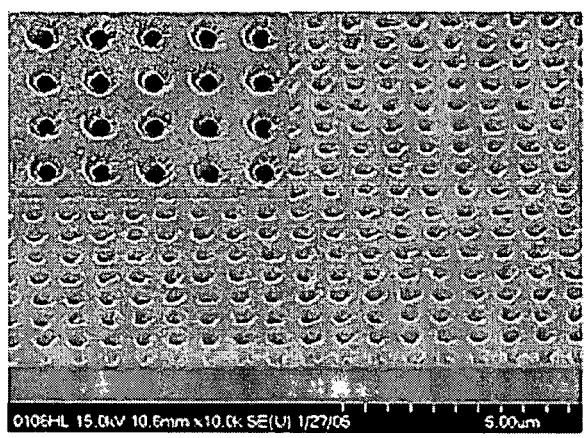

FIGS. 5A through 5C are scanning electron microscopy (SEM) images showing a light emitting device manufactured using a method according to an embodiment of the present invention.

Referring to FIG. 5A, the sacrificial layer 110 having the island array 110a is formed by depositing ITO to a thickness of 30 nm as the first conductive material layer 100 on the second cladding layer 50, exposing a photoresist layer for forming the sacrificial layer 110, the photoresist layer formed on the first conductive material layer using a 363 nm argon ion ($Ar^+$) laser hologram, and developing the sacrificial layer 110 using a subsequent develop process.

Each of the islands 110a in the sacrificial layer 110 has a diameter of 200 nm, and a height of 600 nm, and a pitch of 750 nm exists between the islands 110a.

The effect of the periodic island pattern is strong when the grating pitch (A) is at a multiple of m*wavelength/4*n, where m is an integer and n is a refractive index of the island.

As m increases, the resonance effect decreases. Accordingly, considering a wavelength of 400 to 500 nm and a refractive index of 2.5 which are currently used ranges, the appropriate range of the grating pitch ($\Lambda$) is from at least 40 nm at m=1 to at most 1000 nm (1 μm) at m=20. When m is greater than 20, the effect is insignificant.

FIG. 5B is an SEM image taken after ITO has been deposited to a thickness of 170 nm as the second conductive material layer 120 on the structure shown in FIG. 5A. FIG. 5C is an SEM image showing the second conductive material layer 120 after removing the sacrificial layer of FIG. 5B, i.e., after a lift-off process has been performed. Referring to FIG. 5C, holes which have a well shape are formed with a periodic arrangement on the second conductive material layer 120 through the lift-off process using the sacrificial layer.

Figure 6:
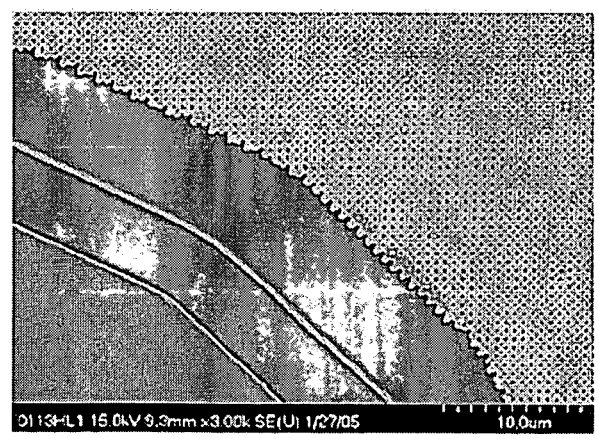
FIG. 6 is an SEM image showing an upper ohmic contact layer of a blue light emitting device manufactured using a method according to an embodiment of the present invention.

FIG. 6 is an SEM image showing an upper ohmic contact layer of a blue light emitting device manufactured using a method according to an embodiment of the present invention. Referring to FIG. 6, the ohmic contact layer 60 formed of the ITO transparent conductive material is formed on the upper portion of the second cladding semiconductor layer, for example, the second cladding layer 50, in a blue InGaN/GaN MQW light emitting device. In FIG. 6, the right portion is the ohmic contact layer 60 and the left dark portion is an n-type electrode.

Figure 7:
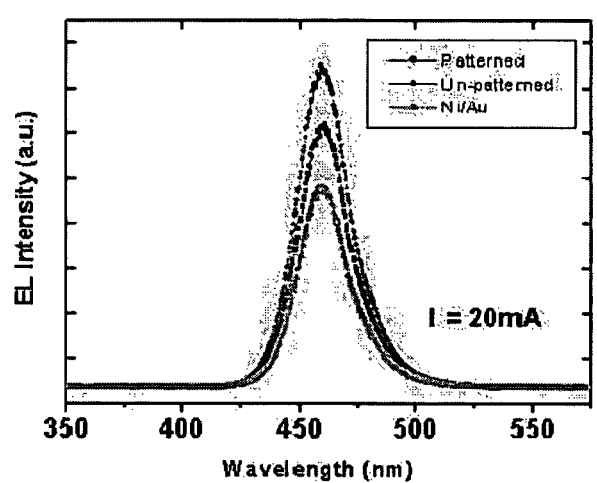
FIG. 7 is graph of electro-luminescence (EL) intensity of a light emitting device manufactured using a method according to an embodiment of the present invention.

FIG. 7 is graph of electro-luminescence (EL) intensity versus wavelength at a current of 20 mA for a light emitting device manufactured using a method according to an embodiment of the present invention. The light emitting device had a structure in which the first ITO conductive material layer 100 having a thickness of 30 nm was formed on the second cladding layer 50 in the blue InGaN/GaN MQW light emitting device shown in FIG. 6 and then the second ITO conductive material layer 120 having a thickness of 170 nm was formed on the first conductive material layer 100 using the above-described hologram lithography.

In addition, as a reference sample, light emitting devices respectively having an unpatterned ITO electrode structure with a thickness of 200 nm and a conventional Ni/Au ohmic electrode structure were manufactured. In particular, to improve the ohmic contact characteristics between the second cladding layer and the ITO transparent conductive thin film layer, a metal thin film layer 70 which was made of Ag and had a thickness of 1 nm was formed therebetween, as illustrated in FIG. 2. After forming an electrode structure in the device, heat-treatment was performed at 500° C. for 2 minutes under an air atmosphere. Referring to FIG. 7, the transparent conductive ohmic electrode structure which is 2 dimensionally patterned according to an embodiment of the present invention shows 21% greater EL intensity than the unpatterned sample and, 54% greater EL intensity than the conventional Ni/Au electrode structure. In particular, the 2-dimensional electrode patterning according to embodiments of the present invention has an advantage in that an increase in the specific contact resistance between the second cladding layer and the ohmic electrode structure is prevented by the presence of the thin first conductive material layer and the 2-dimensional transparent conductive thin film layer having the nano-sized holes.

Figure 8:
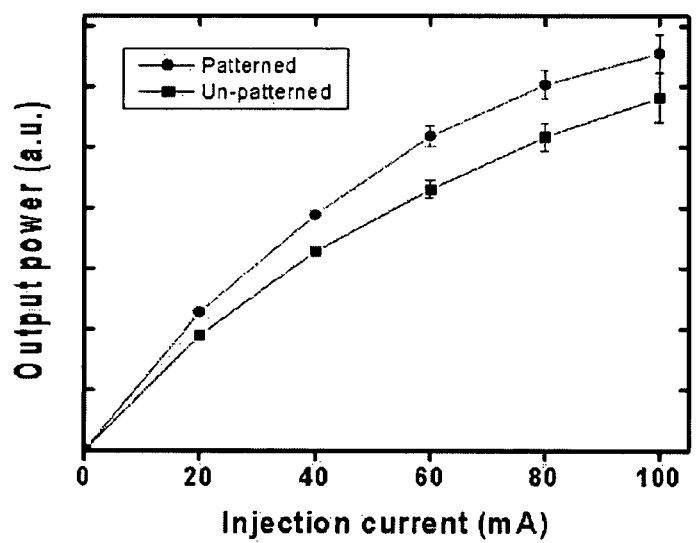
FIG. 8 is a graph showing light output power versus input current of a light emitting device manufactured using a method according to an embodiment of the present invention.

FIG. 8 is a graph of light output power versus input current for a light emitting device with a 2-dimensionally patterned ohmic contact layer and a light emitting device without a 2-dimensionally patterned ohmic contact layer. Referring to FIG. 8, the light emitting device having the 2-dimensionally patterned ohmic contact layer has superior light output power to the light emitting device having none for all input current ranging from 20 to 100 mA.

Figure 9A:
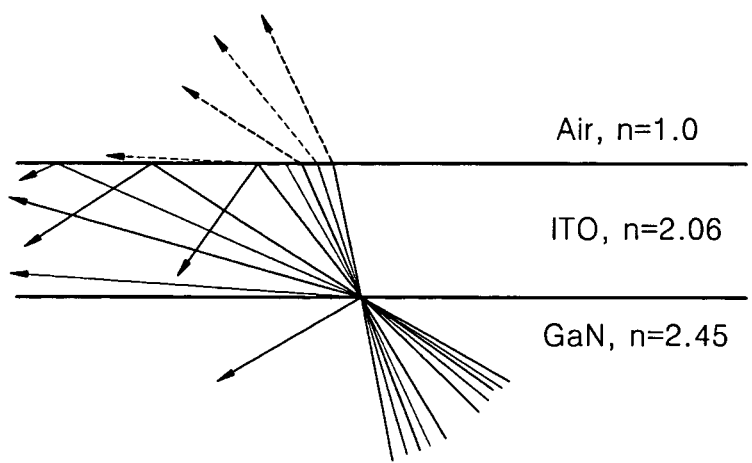
FIGS. 9A and 9B are schematic diagrams illustrating light refraction and reflection in a structure having a second cladding layer, an ITO layer and an air layer with respect to electrode patterning formation according to an embodiment of the present invention.
Figure 9B:
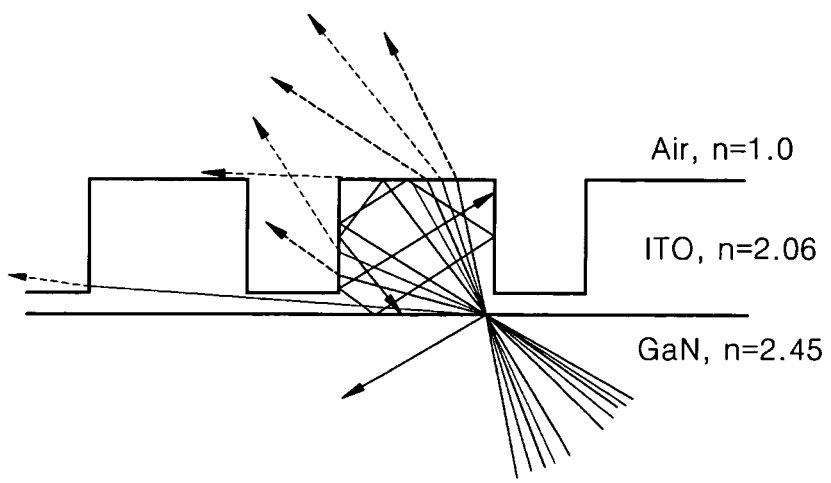

FIGS. 9A and 9B are schematic diagrams that illustrate light refraction and reflection in a structure having a second cladding layer, an ITO layer and, air layer with respect to electrode patterning formation, according to an embodiment of the present invention. FIGS. 9A and 9B illustrate a principal by which light output power of an ohmic contact layer which is 2-dimensionally patterned, that is, has a 3-dimensional pattern, is improved according to an embodiment of the present invention. The second cladding layer, the ITO transparent conductive thin film layer, and the air layer respectively have refractive indexes of 2.45, 2.06, and 1.0 at a wavelength of 450 nm. When light generated by a medium having a refractive index n1 enters another medium having a refractive index n2, a critical angle is equal to $\sin^{-1}(n2/n1)$ based on Snell's law. When the incident angle of light is greater than the critical angle, the light is reflected, and when the incident angle of light is less than the critical angle, the light is refracted. For example, when light generated in the second cladding layer is incident on the ITO layer, the critical angle of the light is 57°. Referring to FIG. 9A, in the case where the ITO layer is unpatterned, when light generated from the second cladding layer has an incident angle less than the critical angle of 57°, the light is refracted into the ITO layer. However, light having an incident angle greater than the critical angle of 57° is reflected. Meanwhile, another critical angle of 29° exists between the ITO layer and air due to the difference between the refractive indexes of the ITO layer and the air layer, and thus, the light transmitted through the ITO layer is mostly reflected back into the ITO layer, thereby decreasing the light extraction efficiency. However, referring to FIG. 9B, if the surface of the ohmic contact layer is 2-dimensionally patterned according to the embodiment of the present invention, the more light which has refracted into the ITO layer is transmitted to the outside along the sides of the electrode pattern, thereby decreasing the ratio of light reflected back to the inside, and increasing the light extraction efficiency of the light emitting device.

As described above, in the present invention, dry etching, which may damage semiconductor materials, is not performed such that degradation in the electrical characteristics of the device caused by damage due to dry etching can be prevented. In particular, the method of the present invention can ensure that a light emitting device having excellent electric and optical characteristics can be manufactured.

While the present invention has been particularly shown and described with reference to exemplary embodiments thereof, it will be understood by those of ordinary skill in the art that various changes in form and details may be formed therein without departing from the spirit and scope of the present invention as defined by the following claims.

What is claimed is:

1. A method of manufacturing an ohmic contact layer which is used for a light emitting device, the method comprising:
    forming a first conductive material layer on a semiconductor layer;
    forming a mask layer comprising a plurality of nano-sized islands on the first conductive material layer to contact with the first conductive material layer;
    forming a second conductive material layer on the first conductive material layer and on the islands in the mask layer;
    removing the portion of the second conductive material on the islands through a lift-off process using a solvent such that the second conductive material layer has a plurality of nano-sized through-holes corresponding to the nano-sized islands; and
    forming a conductive pad on a part of the surface of the second conductive material layer having a plurality of nano-sized through-holes, the second conductive material layer being exposed to the outside,
    wherein the first and second conductive material layers are formed of an identical transparent conductive material and form a layer, and
    whereby the layer comprising the first and second conductive layers is provided as the ohmic contact layer,
    wherein a plurality of nano-sized islands have a pitch of A and satisfy $A = m \times \lambda / 4 \times n$ (m: integer, $\lambda$: wavelength of the light emitting device, n: refractive index of the first and second conductive material layers),
    wherein the forming of the mask layer comprises:
    coating a photoresist on the first conductive material layer;
    exposing the photoresist with a first laser and second laser to form a latent image corresponding to the islands in the photoresist, the exposing of the photoresist being performed through laser holography using laser interference, wherein the first laser is directly radiated onto the photoresist and the second laser is indirectly radiated thereunto through a reflector such that an interference pattern is formed; and
    forming the islands on the first conductive material layer by developing the photoresist using a solvent,
    wherein the exposing the photoresist with the first laser and second laser comprises:
    exposing the photoresist with the first laser;
    rotating a structure which comprises the semiconductor layer, the first conductive material layer formed on the semiconductor layer, and the photoresist formed on the first conductive material layer; and
    after rotating the structure, exposing the photoresist with the second layer.

2. The method of claim 1, wherein the transparent conductive material of the first and second conductive material layers comprises transparent conductive oxide or transparent conductive nitride.

3. The method of claim 2, wherein the transparent conductive oxide comprises at least one metal oxide and the metal is selected from the group consisting of In, Sn, Zn, Ga, Ce, Cd, Mg, Be, Ag, Mo, V, Cu, Ir, Rh, Ru, W, Co, Ni, Mn, Al, and lanthanide metals.

4. The method of claim 2, wherein the transparent conductive nitride is titanium nitride or tantalum nitride.

5. The method of claim 1, further comprising, before the forming of the first conductive material layer, forming a metal thin film layer on the semiconductor layer, wherein the first conductive material layer is formed on the metal thin film layer.

6. The method of claim 5, wherein the metal thin film layer has a thickness of approximately 0.1 to 50 nm.

7. The method of claim 6, wherein the metal thin film layer is formed of a material selected from the group consisting of Ni, Co, Cu, Pd, Pt, Ru, Ir, Au, Ag, Cr, Rh, In, Sn, Mg, Zn, Be, Sr, Ba, an alloy thereof, and a solid solution thereof.

8. The method of claim 5, wherein the metal thin film layer is formed of a material selected from the group consisting of Ni, Co, Cu, Pd, Pt, Ru, Ir, Au, Ag, Cr, Rh, In, Sn, Mg, Zn, Be, Sr, Ba, an alloy thereof, and a solid solution thereof.

9. A method of manufacturing a light emitting device having an ohmic contact layer, the method comprising:
    forming a stacked structure comprising a first cladding semiconductor layer, an activation layer, and a second cladding semiconductor layer on a substrate;
    forming a first conductive material layer on the second cladding semiconductor layer;
    forming a mask layer comprising a plurality of islands on the first conductive material layer to contact with the first conductive material layer;
    forming a second conductive material layer on the first conductive material layer and on the islands in the mask layer;
    removing the portion of the second conductive material on the islands and the islands through a lift-off process using a solvent such that the second conductive material layer has a plurality of nano-sized through-holes corresponding to the nano-sized islands; and
    forming a conductive pad on a part of the surface of the second conductive material layer having a plurality of nano-sized through-holes, the second conductive material layer being exposed to the outside,
    wherein the first and second conductive material layers are formed of an identical transparent conductive material and form a layer,
    whereby the layer comprising the first and second conductive layers is provided as the ohmic contact layer,
    wherein a plurality of nano-sized islands have a pitch of A and satisfy $A = m \times \lambda / 4 \times n$ (m: integer, $\lambda$: wavelength of the light emitting device, n: refractive index of the first and second conductive material layers),
    wherein the forming of the mast layer comprises:
    coating a photoresist on the first conductive material layer;
    exposing the photoresist with a first laser and second laser to form a latent image corresponding to the islands in the photoresist, the exposing of the photoresist being performed through laser holography using laser interference, wherein the first laser is directly radiated onto the photoresist and the second laser is indirectly radiated thereunto through a reflector such that an interference pattern is formed; and forming the islands on the first conductive material layer by developing the photoresist using a solvent, wherein the exposing the photoresist with the first laser and second laser comprises:

exposing the photoresist with the first laser;

rotating a structure which comprises the semiconductor layer, the first conductive material layer formed on the semiconductor layer, and the photoresist formed on the first conductive material layer; and after rotating the structure, exposing the photoresist with the second layer.

10. The method of claim 9, wherein the transparent conductive material of the first and second conductive material layers comprises a transparent conductive oxide or transparent conductive nitride.

11. The method of claim 10, wherein the transparent conductive oxide comprises at least one metal oxide and the metal is selected from the group consisting of In, Sn, Zn, Ga, Ce, Cd, Mg, Be, Ag, Mo, V, Cu, Ir, Rh, Ru, W, Co, Ni, Mn, Al, and lanthanide metals.

12. The method of claim 10, wherein the transparent conductive nitride is titanium nitride or tantalum nitride.

13. The method of claim 9, further comprising, before the forming of the first conductive material layer, forming a metal thin film layer on the semiconductor layer, wherein the first conductive material layer is formed on the metal thin film layer.

14. The method of claim 13, wherein the metal thin film layer has a thickness of approximately 0.1 to 50 nm.

15. The method of claim 14, wherein the metal thin film layer is formed of a material selected from the group consisting of Ni, Co, Cu, Pd, Pt, Ru, Ir, Au, Ag, Cr, Rh, In, Sn, Mg, Zn, Be, Sr, Ba, an alloy thereof, and a solid solution thereof.

16. The method of claim 13, wherein the metal thin film layer is formed of a material selected from the group consisting of Ni, Co, Cu, Pd, Pt, Ru, Ir, Au, Ag, Cr, Rh, In, Sn, Mg, Zn, Be, Sr, Ba, an alloy thereof, and a solid solution thereof.

17. The method of claim 9, wherein the first conductive material layer has a thickness of approximately 0.1 to 300 nm, and the second conductive material layer has a thickness of approximately 20 to 700 nm.

18. The method of claim 9, wherein the first conductive material and the second conductive material in which the through holes are formed form an electrode, the method further comprising:

heat-treating the electrode at a temperature ranging from room temperature to approximately 900° C. for approximately 10 seconds to 3 hours.

19. The method of claim 18, wherein the heat-treating of the electrode is performed under a gaseous atmosphere containing at least one of nitrogen, argon, helium, oxygen, hydrogen, and air, or under a vacuum.

* * * * *